United States Patent [19]

Andrews et al.

[11] 4,281,287
[45] Jul. 28, 1981

[54] MAGNETIC TAPE LEADS FOR PROBES IN ELECTROMAGNETIC RADIATION

[75] Inventors: Charles L. Andrews, Albany, N.Y.; Lorne H. Belden, Jr., Louisville, Ky.

[73] Assignee: General Electric Company, Schenectady, N.Y.

[21] Appl. No.: 28,179

[22] Filed: Apr. 9, 1979

[51] Int. Cl.³ .................. G01R 21/04; G01R 19/22; G01R 33/02

[52] U.S. Cl. .................. 324/95; 324/119; 324/247; 343/703; 343/787; 343/788

[58] Field of Search .............. 324/95, 119, 106, 247; 343/703, 787, 788; 325/67, 133; 338/212, 307; 455/67, 115; 340/600

[56] References Cited

U.S. PATENT DOCUMENTS

| 3,721,900 | 3/1973 | Andrews | 324/95 |
| 3,794,914 | 2/1974 | Aslan | 324/95 |
| 4,023,093 | 5/1977 | Aslan | 324/95 |

OTHER PUBLICATIONS

Green, F. M., "Development of Electric ...", National Bureau of Standards Tech. Note 658, Jan. 1975.

*Primary Examiner*—Ernest F. Karlsen
*Attorney, Agent, or Firm*—Donald R. Campbell; James C. Davis; Marvin Snyder

[57] ABSTRACT

Electrically conducting magnetic recording tape having a coating of $\gamma$-$Fe_2O_3$ particles on a polyester substrate is used as leads for probes in oven cavities and other microwave fields. The tape leads are flexible, have a high resistance per unit length, and are nearly transparent to electromagnetic waves. Electric diode-dipole probes with such leads are uniquely electric and a magnetic loop detector is uniquely magnetic.

5 Claims, 6 Drawing Figures

MAGNETIC TAPE LEADS FOR PROBES IN ELECTROMAGNETIC RADIATION

RELATED APPLICATION

This application is related to concurrently filed Ser. No. 028,180, R. A. Dehn, "Temperature Sensing Probe for Microwave Ovens", assigned to the same assignee.

BACKGROUND OF THE INVENTION

This invention relates to the use of iron oxide magnetic tape as high resistance electrical conductors in electromagnetic radiation, and to improved electric and magnetic probes made possible by such leads.

Until about ten years ago, fine twisted pairs of nichrome or Evanohm (Ni-Cr-Al) wire were the leads for electric and magnetic probes of microwave fields, and these were replaced by carbon impregnated Teflon® leads developed at the U.S. Bureau of Standards at Boulder, Colo.

Prior art diode-detector probes used in free space measurements were not uniquely electric or magnetic. In electric probes, the connections of the twisted leads to the two sides of the detector formed a small magnetic loop probe superimposed on the electric probe. Precaution was taken to orient the plane of the loop parallel to the magnetic field; that precaution was difficult to accomplish in measurements near objects. Previous attempts to employ square loop diode-detector magnetic probes in free space have failed. Even for the two orientations 180° apart in which the side containing the diode was perpendicular to the electric field, the electrometer readings differed by as much as 10 percent.

SUMMARY OF THE INVENTION

Electrically conducting iron oxide magnetic tape is employed as improved high resistance leads for probes in electromagnetic radiation to transmit dc and low frequency voltages from a detector or other sensor to utilization circuitry. The tape leads are flexible, have a high resistance per unit length and are minimally perturbing to electromagnetic waves, and do not affect the radiation field or convey wave energy away from the detector. It is not essential to cement together the leads, but when adhered together they have a high capacitance per unit length. The magnetic tape is Scotch Brand Magnetic Tape No. 971 or its equivalent, and has a coating of contacting particles of $\gamma$-$Fe_2O_3$ on a polyester substrate.

Electric probes which are uniquely electric and magnetic probes which are uniquely magnetic are constructed with these high resistance, transparent leads. The former are comprised of a dipole antenna and a Schottky diode or point contact diode detector at the center. The potential difference generated by the detector is related to the magnitude of the electric field and is conveyed by the tape leads to an electrometer or to a control device. A magnetic probe has a small loop antenna and a capacitor and Schottky diode detector connected into the loop such that a potential difference developed across the diode is related to the magnitude of the magnetic field. The preferred embodiments are for measurement of the microwave field components in microwave ovens or for control of microwave ovens.

DESCRIPTION OF THE PREFERRED EMBODIMENTS

Improved leads for probes in microwave fields and other electromagnetic radiation are made of electrically conducting iron oxide magnetic recording tape such as Scotch Brand Magnetic Tape No. 971 sold by Minnesota Mining and Manufacturing Company. This magnetic tape has a coating of contacting and aligned particles of $\gamma$-$Fe_2O_3$, which is structurally like magnetite, and a polyethylene substrate having a melting point of 315° C. The particles are deposited as an iron oxide dust intimately mixed with a special lacquer and applied to the tape in a layer between 15 microns and 40 microns thick. A heat treatment is used at 250° C.–300° C. to convert the particles into $\gamma$-$Fe_2O_3$ without changing the shape of the particles. The particles have a mean length of 1 micron and a width of 0.1 microns, and the final mean thickness of the magnetic material is 53 microns. Recent tapes with a magnetic layer of $CRO_2$ are not suitable for leads because its Curie temperature is too low (130° C.), and although the $CrO_2$ particles are more conducting than iron oxide, the particles on the tape do not make contact with each other so that the tape is nonconducting to electricity.

The advantages of such tape leads for probes are as follows. The tape has a high resistance per unit length of about 1.5 megohms per meter, which is three thousand times greater than that of carbon impregnated Teflon leads. The resistance of many samples of tape has been measured and is relatively uniform. The tape is nominally perturbing or nearly transparent to electromagnetic radiation including the microwave spectrum and bands to either side. A third outstanding characteristic is its flexibility, and it also has tensile strength and freedom from microphonic noise. Carbon impregnated Teflon leads generate microphonic noise when they are bent or stretched. It is not necessary to cement together a pair of magnetic tape leads on the smooth side, but if done the adhered together tape has a high capacitance of about $20 \times 10^{-12}$ f/cm. This is two thousand times as much capacitance per length as that of the twisted leads of carbon impregnated Teflon. These high resistance, transparent, flexible leads make it possible to construct improved electric and magnetic probes; electric potential differences from probes may be conveyed to electrometers or control devices without substantially perturbing the electromagnetic waves and without altering the elemental electric and magnetic probes.

Figure 1:
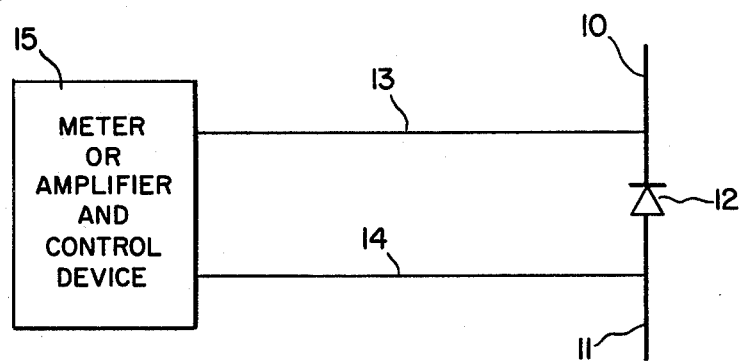
FIG. 1 is a schematic diagram of an electric dipole probe for measurement or control.

An electric probe which is uniquely electric, for microwave oven measurement and control and other applications, is shown schematically in FIG. 1. A dipole antenna has two colinear wings 10 and 11 that are connected at the center by a diode detector 12, and the two wings are preferably substantially shorter than one-quarter wavelength. The probe is oriented so that the dipole wings are parallel to the electric field vector, and currents induced in the dipole are rectified by the diode which generates a potential difference proportional to or related to the magnitude of the electric field. Magnetic tape leads 13 and 14 connected across diode detector 12 transmit the potential difference to utilization circuitry 15, either a meter with built-in amplifier or an amplifier and control device. For measurement purposes, an electrometer, which is a high input impedance instrument, is used, and exemplary control systems for microwave ovens adjust the input power or turn off the oven. A negligible amount of microwave energy is coupled to high resistance tape leads 13 and 14, and the leads will transmit a dc voltage or an audio frequency voltage.

Figure 2:
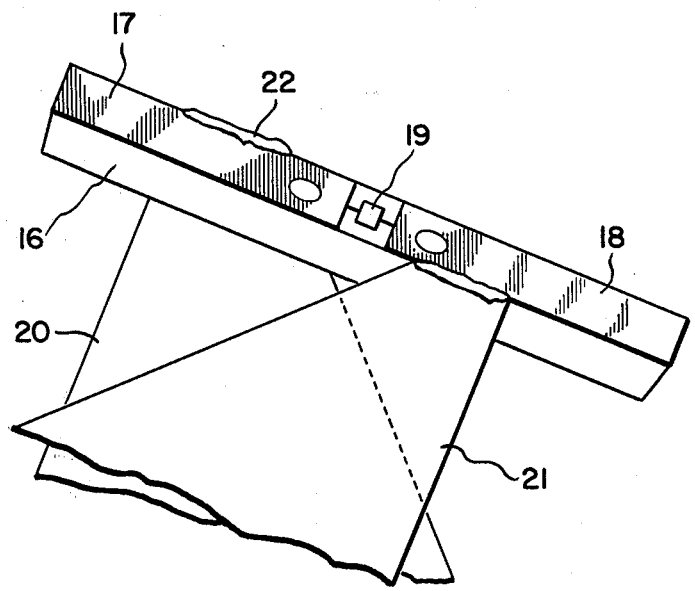
FIG. 2 is a perspective of one embodiment of the foregoing with a Schottky diode detector and iron oxide magnetic tape leads.

In FIG. 2, an electric dipole probe has a Schottky diode at the center and two leads of magnetic tape are attached with electrically conducting epoxy. A bar 16 of alumina clad with gold foil is etched to delineate dipole wings 17 and 18. A Schottky diode chip 19 is attached to the alumina between the two wings and lead connections are provided. One-quarter inch iron oxide magnetic tape is tapered at the end, and the two magnetic tape leads 20 and 21 are connected to dipole wings 17 and 18 by silver loaded conductive epoxy 22. The magnetic tape may be slit in half or in quarters so that the lead width is one-eighth or one-sixteenth of an inch. The polyester sides of the leads can be cemented together, but this is not essential. If cemented together, there is a high shunt capacitance across the diode detector.

Figure 3:
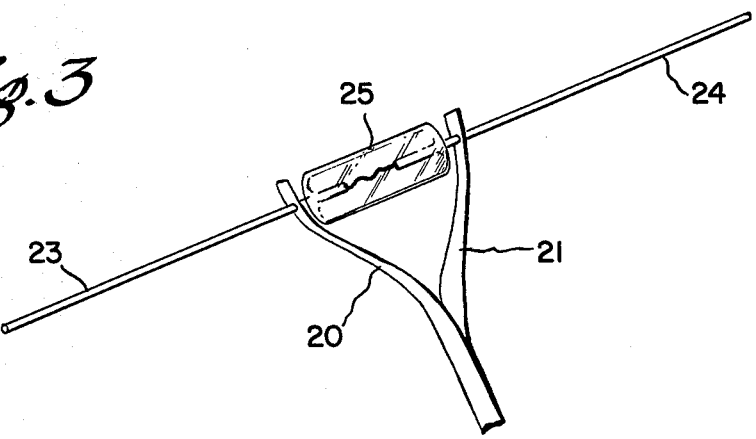
FIG. 3 shows another embodiment of the electric dipole probe with a point contact diode detector.

The embodiment in FIG. 3 is an electric dipole probe with a glass encapsulated point contact diode at the center. The two wire leads 23 and 24 of point contact diode 25 serve as the dipole wings, and tape leads 20 and 21 are pierced by the wire leads and pushed down and a connection made with silver loaded epoxy. Prior art electric probes were not uniquely electric because the connections of twisted leads to the two sides of the detector formed a small magnetic loop probe superimposed on the electric probe. When the high resistance, transparent tape leads are used, the magnetic loop is effectively eliminated.

Figure 4:
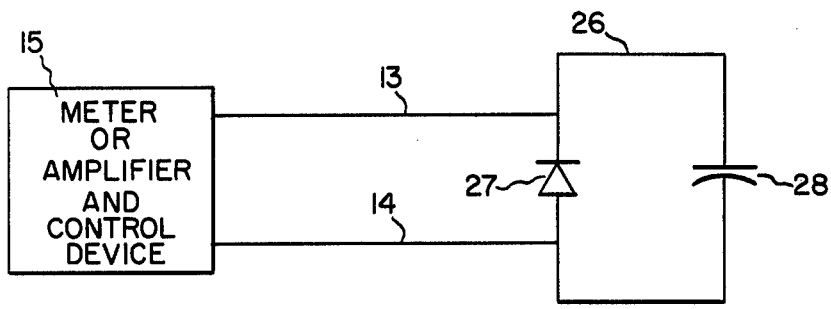
FIG. 4 is a schematic diagram of a magnetic loop detector for measurement or control.
Figure 5:
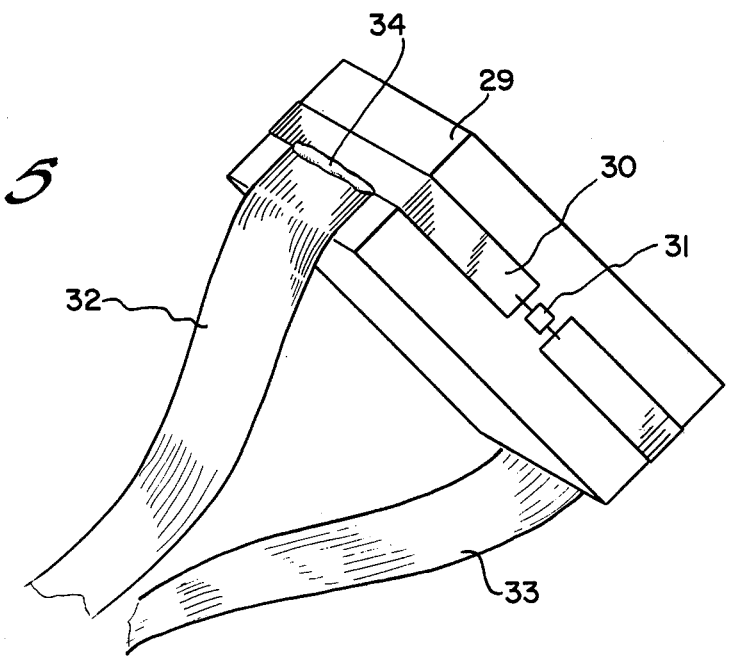
FIG. 5 is an embodiment of the magnetic probe with a Schottky didoe and magnetic tape leads.

The magnetic probe depicted schematically in FIG. 4 is uniquely magnetic. The magnetic loop detector has a small loop antenna 26 with a Schottky diode 27 on one side of the loop and a miniature capacitor 28 on the other side of the loop. The capacitor completes the loop and is blocking to dc voltage. With the plane of the loop oriented perpendicular to the magnetic field vector, microwave energy induces a current flow in the loop which is rectified by the diode detector. The potential difference across the diode is related to the magnitude of the magnetic field and is conveyed by tape leads 13 and 14 to the utilization circuitry 15. The magnetic probe in FIG. 5 is built of a block of alumina 29 having a continuous gold foil loop 30 that is broken on one side to insert a capacitor and on the other side a Schottky diode chip 31. Magnetic tape leads 32 and 33 are connected to the remaining sides of gold foil loop 30 by conducting epoxy 34. Using the magnetic probe with tape leads for field measurements, for the two orientations 180° apart in which the side containing the diode is perpendicular to the electric field, electrometer readings differ by less than 0.5 percent for the two orientations. This probe is suitable for magnetic measurements in free space or in dielectrics.

Figure 6:
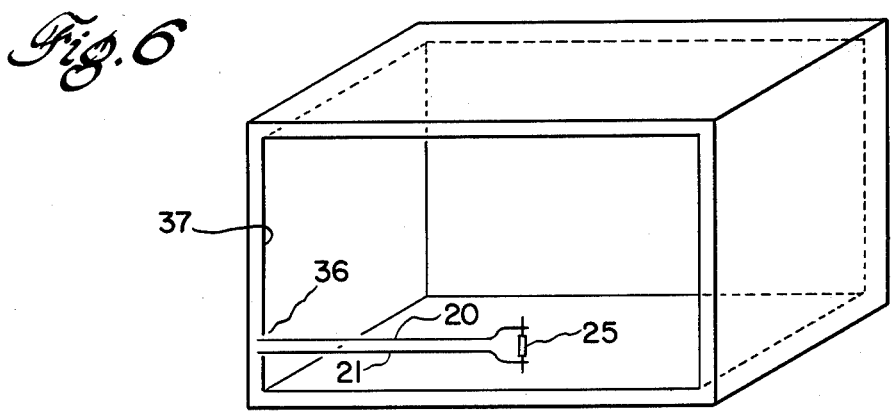
FIG. 6 is a partial perspective of a microwave oven and a probe with leads passing through a hole in the oven liner.

Referring to FIG. 6, a microwave oven has a small hole 36 in the metallic oven liner 37 for passage of magnetic tape leads 20 and 21. There is little loss of microwave energy to the ambient because electromagnetic waves do not propagate along the tape leads which, if the converse situation were true, would be the center conductor of a coaxial transmission line. An electric probe with point contact diode 25 is illustrated by way of example. For measurement purposes, the electric probe is stepped along in a grid pattern to map the field distribution in the oven cavity. For control purposes, the probe is mounted in stationary position at a point of high electric field, or a point of high magnetic field in the case of the magnetic probe, within the oven. The tape leads are sufficiently flexible that they can be passed through the oven door opening and the door can be closed upon the leads. The Q of a microwave oven with even a minimal load is low enough that the impedance of the tape leads is relatively high compared to the wave impedance. Probes with these leads are less advantageous for instance in a resonantor with a high Q where the impedance at voltage maxima is relatively high.

A high impedance four wire temperature sensing system comprised of a sensing element such as a thermistor and four magnetic tape leads or other high resistance leads is disclosed and claimed in concurrently filed application Ser. No. 028,180. A constant current is impressed on the sensor by two leads and the voltage across the sensor is read via the other two.

While the invention has been particular shown and described with reference to several preferred embodiments thereof, it will be understood that various changes in form and details may be made therein without departing from the spirit and scope of the invention.

The invention claimed is:

1. A uniquely electric probe for detecting the electric field component of electromagnetic radiation comprising: a dipole antenna and associated diode detector for generating a potential difference related to the magnitude of the electric field, and a pair of leads connected across said detector to transmit the potential difference to utilization circuitry, said leads being electrically conductive flexible magnetic tape that has a high resistance per unit length and is minimally perturbing to the electromagnetic waves and is comprised of an insulating substrate having a coating of contacting $\gamma$-$Fe_2O_3$ particles.

2. The electric probe of claim 1 wherein said dipole antenna has colinear wings and said detector is a Schottky diode mounted between said colinear wings, and the resistance per unit length of said magnetic tape is about 1.5 megohms per meter.

3. The electric probe of claim 1 wherein said detector is a point contact diode having a pair of wire leads which are said dipole antenna, and the resistance per unit length of said magnetic tape is about 1.5 megohms per meter.

4. A uniquely magnetic probe for detecting the magnetic field component of electromagnetic radiation comprising: a small loop antenna and a capacitor and diode detector connected in the loop to generate a potential difference related to the magnitude of the magnetic field, and a pair of leads connected across said detector to transmit the potential difference to utilization circuitry, said leads being electrically conductive flexible magnetic tape that has a high resistance per unit length and is minimally perturbing to the electromagnetic waves and is comprised of an insulating substrate having a coating of contacting $\gamma$-$Fe_2O_3$ particles.

5. The magnetic probe of claim 4 wherein said detector is a Schottky diode, and the resistance per unit length of said magnetic tape is about 1.5 megohms per meter.

* * * * *